(12) United States Patent
Sekine

(10) Patent No.: US 11,108,979 B2
(45) Date of Patent: Aug. 31, 2021

(54) PHOTOELECTRIC CONVERSION DEVICE, IMAGING SYSTEM, AND MOVING BODY

(71) Applicant: CANON KABUSHIKI KAISHA, Tokyo (JP)

(72) Inventor: Hiroshi Sekine, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/084,478

(22) Filed: Oct. 29, 2020

(65) Prior Publication Data

US 2021/0136308 A1    May 6, 2021

(30) Foreign Application Priority Data

Nov. 1, 2019    (JP) .............................. JP2019-199911

(51) Int. Cl.
| | | |
|---|---|---|
| *H04N 5/374* | (2011.01) | |
| *H04N 5/378* | (2011.01) | |
| *H04N 9/04* | (2006.01) | |
| *H01L 27/146* | (2006.01) | |
| *H04N 5/3745* | (2011.01) | |

(52) U.S. Cl.
CPC ....... *H04N 5/3742* (2013.01); *H04N 5/37457* (2013.01); *H04N 9/0455* (2018.08); *H04N 5/378* (2013.01)

(58) Field of Classification Search
CPC .. H04N 5/37457; H04N 5/3742; H04N 5/374; H04N 5/3745; H04N 5/378; H04N 9/0455; H01L 27/14609; H01L 27/14603; H01L 27/14621; H01L 27/14643

USPC .............. 348/300, 301, 302, 308, 294, 297; 257/291, 292; 250/208.1
See application file for complete search history.

(56) References Cited

U.S. PATENT DOCUMENTS

| | | | | |
|---|---|---|---|---|
| 2006/0023109 A1* | 2/2006 | Mabuchi | ............ | H04N 5/37457 348/308 |
| 2007/0091190 A1* | 4/2007 | Iwabuchi | ............... | H04N 5/335 348/294 |
| 2011/0007196 A1* | 1/2011 | Yamashita | ............. | H04N 5/335 348/294 |

(Continued)

FOREIGN PATENT DOCUMENTS

| | | |
|---|---|---|
| EP | 3282689 A1 | 2/2018 |
| JP | 2009296574 A | 12/2009 |

(Continued)

*Primary Examiner* — Marly S Camargo
(74) *Attorney, Agent, or Firm* — Canon U.S.A., Inc. IP Division

(57) ABSTRACT

Provided is a photoelectric conversion device including a first holding portion that holds charges transferred from at least one of a first photoelectric conversion unit, a second photoelectric conversion unit, and a third photoelectric conversion unit, the first photoelectric conversion unit and the second photoelectric conversion unit are arranged adjacent to each other along a first direction, the first photoelectric conversion unit and the third photoelectric conversion unit are arranged adjacent to each other along a second direction, which is different from the first direction, and the first holding portion is arranged at a position at least partially overlapping a straight line connecting the optical center of the second photoelectric conversion unit to the optical center of the third photoelectric conversion unit.

20 Claims, 11 Drawing Sheets

(56) References Cited

U.S. PATENT DOCUMENTS

| | | | |
|---|---|---|---|
| 2013/0049082 A1* | 2/2013 | Kato | H01L 31/02 |
| | | | 257/292 |
| 2015/0124139 A1* | 5/2015 | Ishiwata | H04N 5/3742 |
| 2016/0234425 A1 | 8/2016 | Katagawa | |
| 2017/0125466 A1 | 5/2017 | Kimura | |
| 2017/0330909 A1* | 11/2017 | Wan | H01L 27/14627 |
| 2018/0182800 A1* | 6/2018 | Sekine | H04N 5/378 |
| 2018/0301509 A1* | 10/2018 | Ishii | H01L 27/307 |
| 2020/0389608 A1* | 12/2020 | Baek | H01L 27/14627 |
| 2020/0403025 A1* | 12/2020 | Kim | H01L 27/14685 |

FOREIGN PATENT DOCUMENTS

| | | |
|---|---|---|
| JP | 2010118874 A | 5/2010 |
| JP | 2016144183 A | 8/2016 |
| JP | 2017085065 A | 5/2017 |
| WO | 2016163240 A | 10/2016 |

* cited by examiner

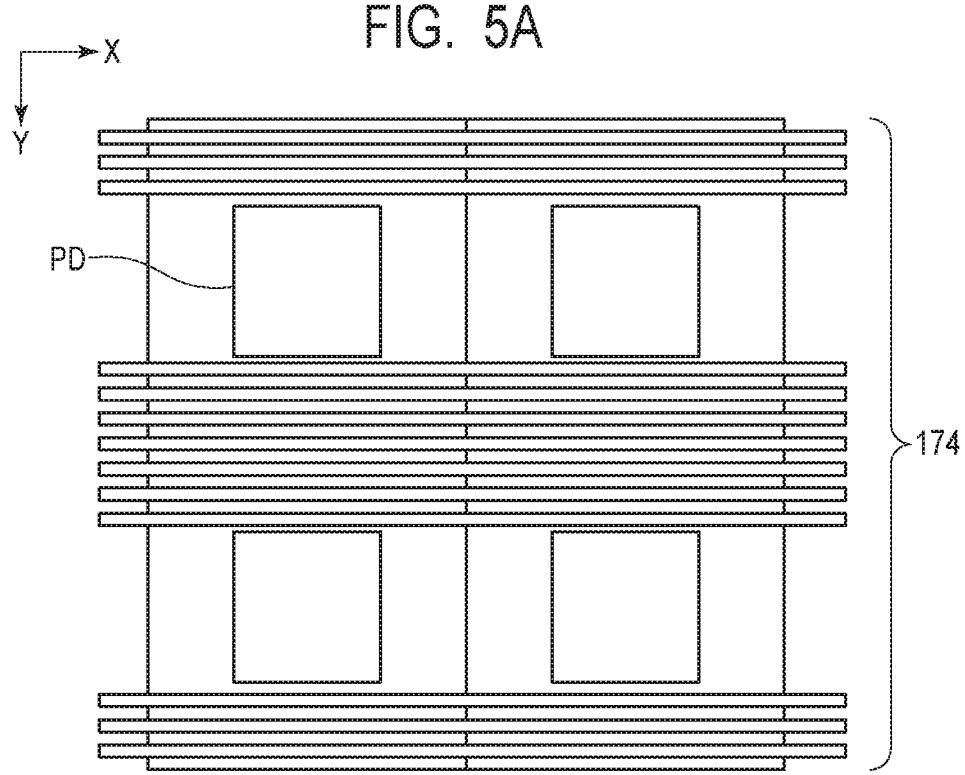
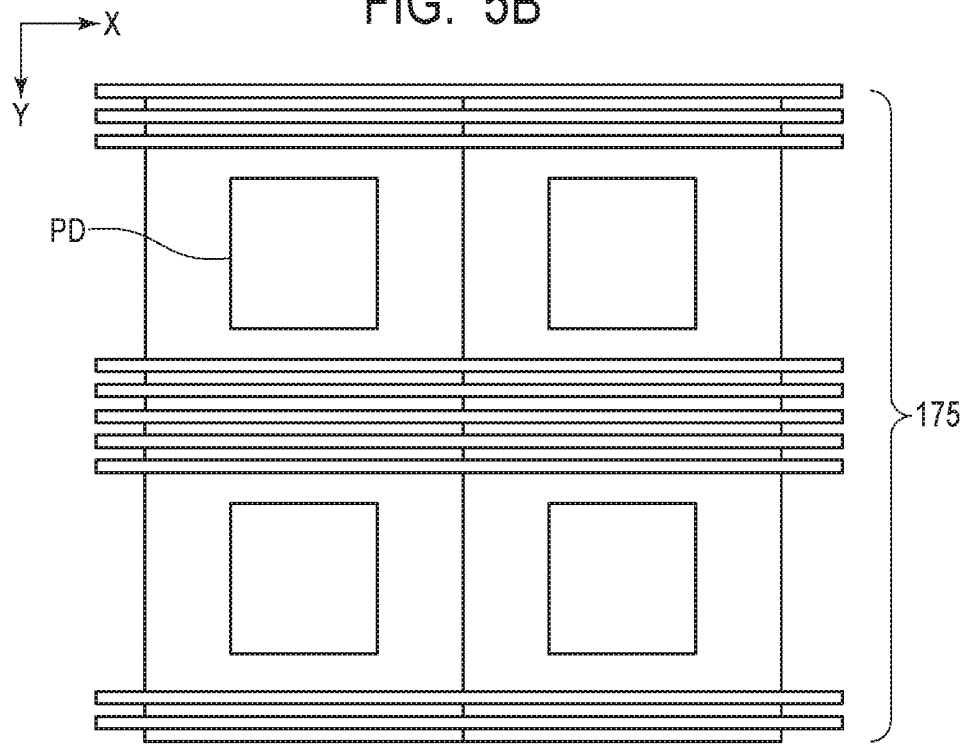

FIG. 7

| CONTROL SIGNAL | NON-ADDITION | ROW ADDITION | COLUMN ADDITION | 2x2 ADDITION | 3-PIXEL ADDITION |
|---|---|---|---|---|---|
| GS0 | LOW | LOW | LOW | LOW | LOW |
| GS1 | HIGH | HIGH | HIGH | HIGH | HIGH |
| GS2 | LOW | LOW | HIGH | HIGH | HIGH |
| GS3 | HIGH | HIGH | LOW | LOW | LOW |
| GS4 | LOW | HIGH | LOW | HIGH | HIGH |
| GS5 | LOW | LOW | LOW | HIGH | LOW |
| GS6 | LOW | HIGH | LOW | LOW | LOW |
| GS7 | HIGH | LOW | HIGH | LOW | LOW |
| GS8 | LOW | LOW | HIGH | LOW | HIGH |
| GS9 | HIGH | LOW | LOW | LOW | LOW |
| READ SIGNAL | A B C D | A+C B+D | A+B C+D | A+B+C+D | A+B+C D |

| CONTROL SIGNAL | NON-ADDITION | 2x2 ADDITION |
|---|---|---|
| GS0 | LOW | LOW |
| GS1 | HIGH | HIGH |
| GS2 | LOW | HIGH |
| GS3 | HIGH | LOW |
| READ SIGNAL | A B C D | A+B+C+D |

PHOTOELECTRIC CONVERSION DEVICE, IMAGING SYSTEM, AND MOVING BODY

BACKGROUND

Technical Field

One disclosed aspect of the embodiments relates to a photoelectric conversion device having high sensitivity, an imaging system, and a moving body.

Description of the Related Art

In recent years, CMOS image sensors suitable for low consumption power and high-speed reading have been widely used for photoelectric conversion devices used in digital still cameras, digital video camera, or the like. In CMOS image sensors, those having a function of global electronic shutter to match exposure timings of a plurality of pixels have been proposed. Japanese Patent Application Laid-Open No. 2009-296574 discloses a photoelectric conversion device in which holding portions that hold charges generated by photoelectric conversion for a predetermined period are provided in order to implement the function of global electronic shutter.

To realize higher sensitivity, driving to add charges of a plurality of pixel rows and add charges of a plurality of pixel columns of a photoelectric conversion device may be performed. Japanese Patent Application Laid-Open No. 2009-296574 does not disclose a specific layout that may be applied to a photoelectric conversion device adapted to such addition of charges. Therefore, there is room to improve performance of a photoelectric conversion device by optimizing layout design.

SUMMARY

The present disclosure has been made in view of the problem described above and intends to provide a high-performance photoelectric conversion device, an imaging system, and a moving body.

According to an aspect of the present disclosure, a photoelectric conversion device includes a substrate; a first photoelectric conversion unit, a second photoelectric conversion unit, a third photoelectric conversion unit, a first holding portion, a first transfer unit, a second transfer unit, a third transfer unit, and a first amplifier unit. The first, second, and third photoelectric conversion units are arranged on the substrate and each configured to generate charges in accordance with incident light. The first holding portion is arranged on the substrate and configured to hold charges transferred from at least one of the first photoelectric conversion unit, the second photoelectric conversion unit, and the third photoelectric conversion unit. The first transfer unit is arranged on the substrate and configured to transfer charges from the first photoelectric conversion unit to the first holding portion. The second transfer unit is arranged on the substrate and configured to transfer charges from the second photoelectric conversion unit to the first holding portion. The third transfer unit is arranged on the substrate and configured to transfer charges from the third photoelectric conversion unit to the first holding portion. The first amplifier unit includes an input node configured to receive charges transferred from the first holding portion. The first photoelectric conversion unit and the second photoelectric conversion unit are arranged adjacent to each other along a first direction in plan view with respect to the substrate. The first photoelectric conversion unit and the third photoelectric conversion unit are arranged adjacent to each other along a second direction, which is different from the first direction, in the plan view. The first holding portion is arranged at a position at least partially overlapping a straight line connecting an optical center of the second photoelectric conversion unit to an optical center of the third photoelectric conversion unit in the plan view.

According to another aspect of the present disclosure, a photoelectric conversion device includes a substrate, a first photoelectric conversion unit, a second photoelectric conversion unit, a third photoelectric conversion unit, a fourth photoelectric conversion unit, a first holding portion, a first transfer unit, a second transfer unit, a third transfer unit, a fourth transfer unit, and a first amplifier unit. The first, second, third, and fourth photoelectric conversion units are arranged on the substrate and each configured to generate charges in accordance with incident light. The first holding portion is arranged on the substrate and configured to hold charges transferred from at least one of the first photoelectric conversion unit, the second photoelectric conversion unit, the third photoelectric conversion unit, and the fourth photoelectric conversion unit. The first transfer unit is arranged on the substrate and configured to transfer charges from the first photoelectric conversion unit to the first holding portion. The second transfer unit is arranged on the substrate and configured to transfer charges from the second photoelectric conversion unit to the first holding portion. The third transfer unit is arranged on the substrate and configured to transfer charges from the third photoelectric conversion unit to the first holding portion. The fourth transfer unit is arranged on the substrate and configured to transfer charges from the fourth photoelectric conversion unit to the first holding portion. The first amplifier unit includes an input node configured to receive charges transferred from the first holding portion. The first photoelectric conversion unit and the second photoelectric conversion unit are arranged adjacent to each other along a first direction in plan view with respect to the substrate. The first photoelectric conversion unit and the third photoelectric conversion unit are arranged adjacent to each other along a second direction, which is different from the first direction, in the plan view. The second photoelectric conversion unit and the fourth photoelectric conversion unit are arranged adjacent to each other along the second direction in the plan view. At least a part of the first holding portion is arranged in a region surrounded by the closest apexes of the first photoelectric conversion unit, the second photoelectric conversion unit, the third photoelectric conversion unit, and the fourth photoelectric conversion unit in the plan view.

Further features of the disclosure will become apparent from the following description of exemplary embodiments with reference to the attached drawings.

BRIEF DESCRIPTION OF THE DRAWINGS

FIG. 5A and FIG. 5B are schematic plan views illustrating an example of arrangement of control signal lines according to the first embodiment.

FIG. 7 is a table illustrating an example of a drive method of a first transfer transistor according to the second embodiment.

DESCRIPTION OF THE EMBODIMENTS

Preferred embodiments of the disclosure will now be described in detail in accordance with the accompanying drawings. Note that the same components or corresponding components are labeled with common references throughout multiple drawings, and the description thereof may be omitted or simplified.

First Embodiment

Figure 1:
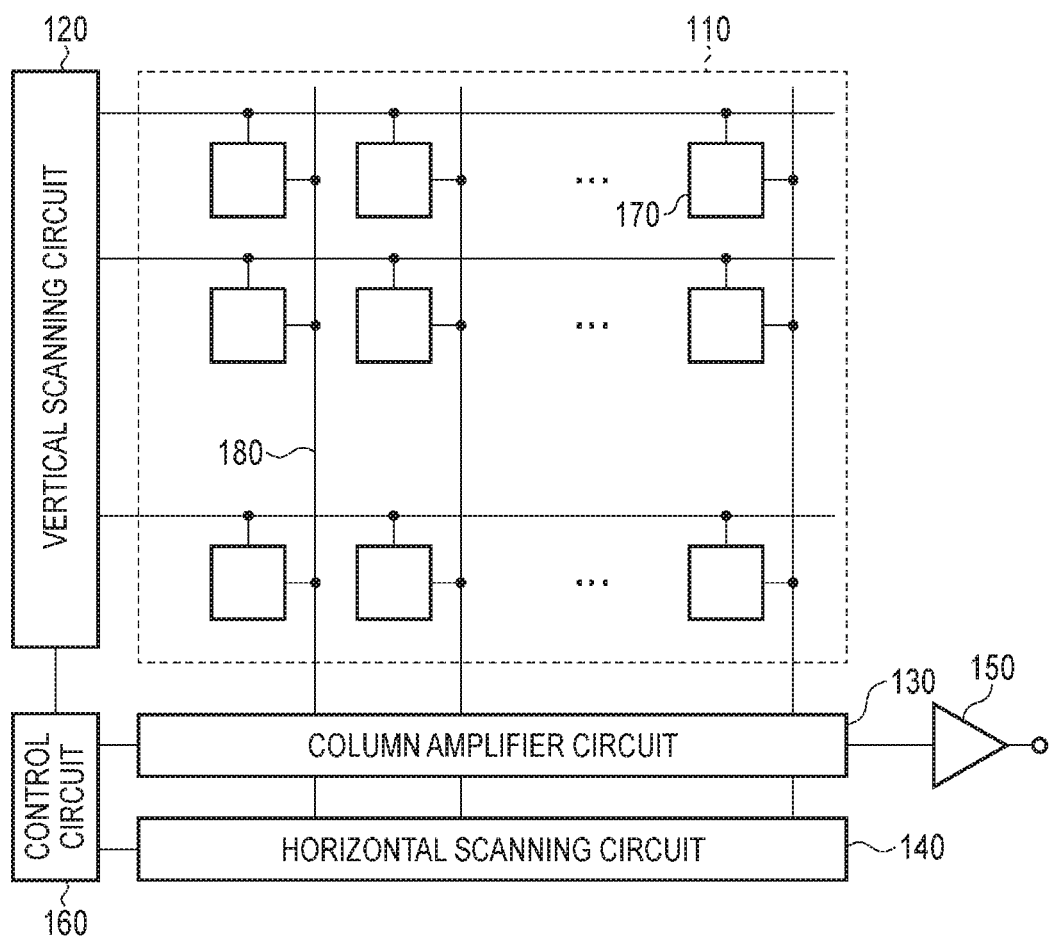
FIG. 1 is a block diagram illustrating a general configuration of a photoelectric conversion device according to a first embodiment.

FIG. 1 is a block diagram illustrating a general configuration of a photoelectric conversion device according to the present embodiment. The photoelectric conversion device may be, for example, an imaging device, a focus detection device, a ranging device, or the like but is not limited thereto. In the present embodiment, the photoelectric conversion device is an imaging device that captures an image such as a static image, a moving image, or the like. The photoelectric conversion device has a pixel array 110, a vertical scanning circuit 120, a column amplifier circuit 130, a horizontal scanning circuit 140, an output circuit 150, and a control circuit 160. The pixel array 110 has a plurality of pixels 170 arranged so as to form a plurality of rows and a plurality of columns.

The control circuit 160 controls drive timings of each component of the vertical scanning circuit 120, the column amplifier circuit 130, and the horizontal scanning circuit 140. The vertical scanning circuit 120 supplies control signals used for controlling a plurality of transistors included in each pixel 170 to enter an on-state (conductive state) or an off-state (nonconductive state). The vertical scanning circuit 120 may be formed of a logic circuit such as a shift register, an address decoder, or the like. A column signal line 180 is provided on each column of the pixel array 110, and signals from the pixels 170 are read out to the column signal lines 180 on a column basis.

The column amplifier circuit 130 performs processes such as an amplification process of signals that have been output to the column signal lines 180, a correlated double sampling process based on a signal obtained at reset and a signal obtained at photoelectric conversion in the pixel 170, or the like. The horizontal scanning circuit 140 supplies control signals used for controlling switches connected to amplifiers of the column amplifier circuit 130 to enter the on-state or the off-state. Thereby, the horizontal scanning circuit 140 performs control to output a signal on a selected column to the output circuit 150. The output circuit 150 is formed of a buffer amplifier, a differential amplifier, or the like and outputs a signal from the column amplifier circuit 130 to a signal processing unit outside the photoelectric conversion device. Note that the column amplifier circuit 130 may include a function of a signal processing circuit that performs signal processing such as correction of a false signal component or the like. An AD converter circuit may be further provided in the photoelectric conversion device, and thereby the photoelectric conversion device may be configured to output digital signals.

Figure 2:
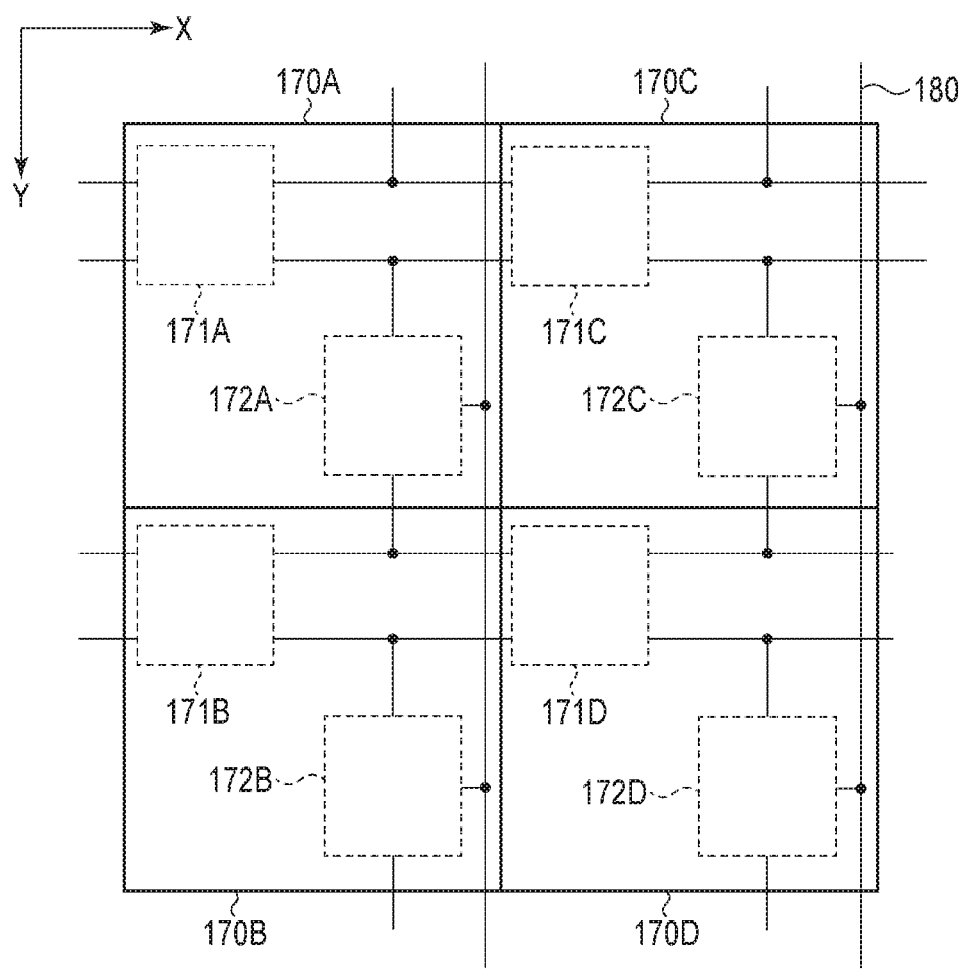
FIG. 2 is a block diagram schematically illustrating a configuration of pixels of two rows by two columns of a pixel array according to the first embodiment.
Figure 3:
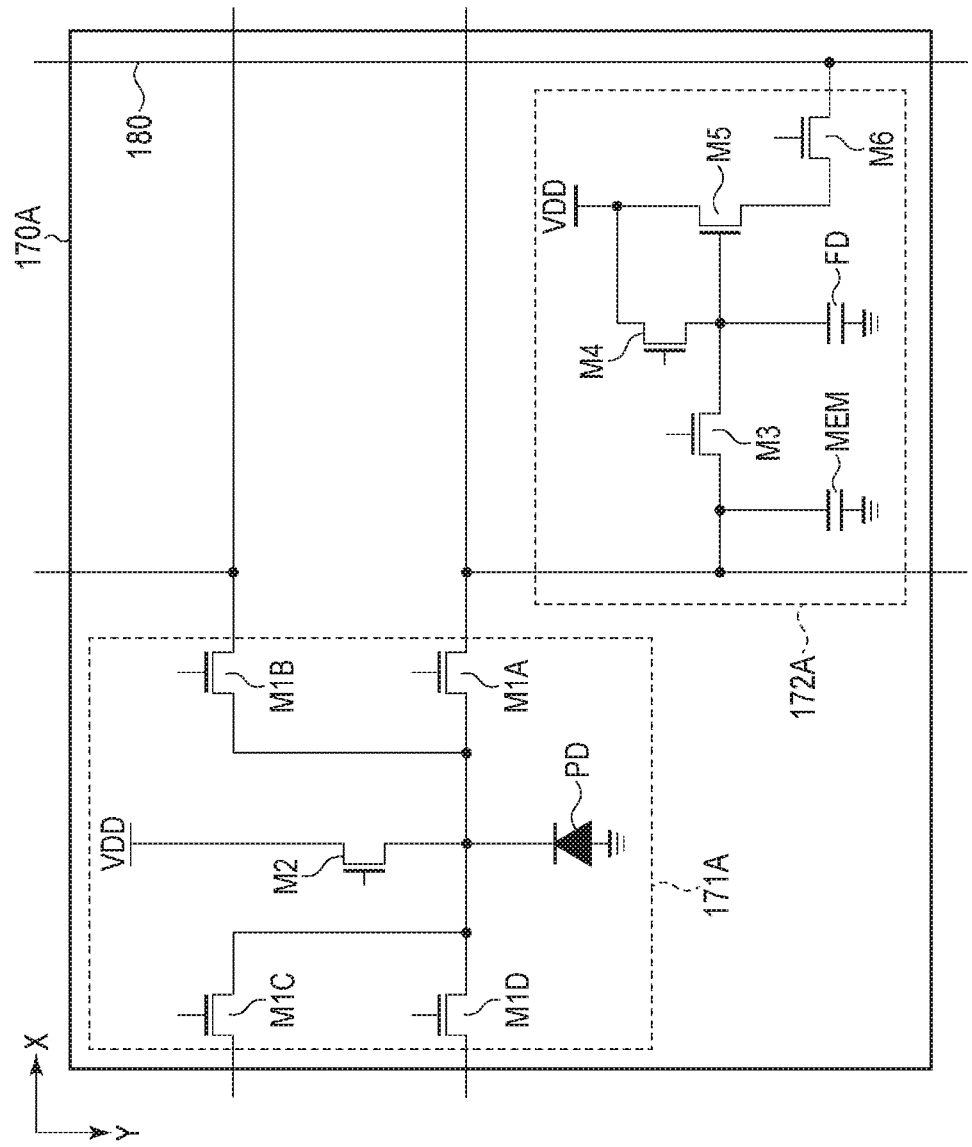
FIG. 3 is an equivalent circuit diagram illustrating a configuration of a pixel according to the first embodiment.

FIG. 2 is a block diagram schematically illustrating a configuration of pixels of two rows and two columns of the pixel array 110 according to the present embodiment. FIG. 3 is an equivalent circuit diagram illustrating a configuration of a pixel according to the present embodiment. The configuration of the pixel 170 will be described in more detail with reference to FIG. 2 and FIG. 3.

FIG. 2 schematically illustrates a configuration of four pixels 170A, 170B, 170C, and 170D included in consecutive two rows and two columns of the pixel array 110. The pixel 170A is arranged on the first row, the first column in FIG. 2. The pixel 170B is arranged on the second row, the first column in FIG. 2. The pixel 170C is arranged on the first row, the second column in FIG. 2. The pixel 170D is arranged on the second row, the second column in FIG. 2. In other words, the pixel 170A and the pixel 170B are aligned in the Y direction (first direction), and the pixel 170C and the pixel 170D are also aligned in the Y direction. The pixel 170A and the pixel 170C are aligned in the X direction (second direction), and the pixel 170B and the pixel 170D are also aligned in the X direction.

The pixel 170A has a first circuit 171A and a second circuit 172A. The pixel 170B has a first circuit 171B and a second circuit 172B. The pixel 170C has a first circuit 171C and a second circuit 172C. The pixel 170D has a first circuit 171D and a second circuit 172D.

The second circuit 172A of the pixel 170A is connected not only to the first circuit 171A of the pixel 170A but also to the first circuit 171B, the first circuit 171C, and the first circuit 171D of other pixels. In other words, the second circuit 172A is connected to all the first circuits of the four pixels 170A, 170B, 170C, and 170D. Further, the second circuit 172A is connected to the column signal line 180 on a corresponding column. This enables addition of signals of pixels on adjacent rows and adjacent columns.

FIG. 3 is an equivalent circuit diagram illustrating a configuration of the pixel 170A. Details of the circuit configuration of the pixel 170A will be described. Note that, since other pixels illustrated in FIG. 2 have the same configuration as the pixel 170A, the description thereof will be omitted.

The pixel 170A has the first circuit 171A and the second circuit 172A. The first circuit 171A has a photoelectric conversion unit PD, four first transfer transistors M1A, M1B, M1C, and M1D, and a discharging transistor M2. The second circuit 172A has a charge holding portion MEM, a second transfer transistor M3, a reset transistor M4, an amplifier transistor M5, and a select transistor M6.

The photoelectric conversion unit PD photoelectrically converts incident light and accumulates charges generated by photoelectric conversion. As the photoelectric conversion unit PD, a photodiode may be used, for example. In the following description, the photoelectric conversion unit PD is assumed to be a photodiode having an anode and a cathode. The anode of the photoelectric conversion unit PD is connected to a ground potential line, and the cathode is connected to the sources of the first transfer transistors M1A, M1B, M1C, and M1D and the source of the discharging transistor M2. The drain of the first transfer transistor M1A is connected to the source of the second transfer transistor M3. The capacitance that is parasitic between the drain of the first transfer transistor M1A and the source of the second transfer transistor M3 forms the charge holding portion MEM. In other words, the charge holding portion MEM is connected to the drain of the first transfer transistor M1A. The drain of the discharging transistor M2 is connected to a power source potential line having a potential VDD.

Further, the charge holding portion MEM of the pixel 170A is also connected to the drain of the first transfer transistor M1D of the pixel 170C adjacent in the X direction and the drain of the first transfer transistor M1B of the pixel 170B adjacent in the Y direction. Furthermore, the charge holding portion MEM of the pixel 170A is also connected to the drain of the first transfer transistor M1C of the pixel 170D located diagonally of a pixel group of two rows by two columns.

The drain of the second transfer transistor M3 is connected to the source of the reset transistor M4 and the gate of the amplifier transistor M5. The connection node of the drain of the second transfer transistor M3, the source of the reset transistor M4, and the gate of the amplifier transistor M5 is a floating diffusion region FD. The drain of the reset transistor M4 is connected to the power source potential line having the potential VDD. The source of the amplifier transistor M5 is connected to the drain of the select transistor M6. The drain of the amplifier transistor M5 is connected to the power source potential line having the potential VDD. The source of the select transistor M6 is connected to the column signal line 180. The column signal line 180 is connected to a current source (not illustrated).

On each row of the pixel array 110, a plurality of control signal lines (not illustrated in FIG. 3) are arranged extending in the X direction. The vertical scanning circuit 120 supplies control signals to the gates of the plurality of transistors within the pixel 170A via the plurality of control signal lines.

When the first transfer transistor M1A is controlled to the on-state by a control signal, charges generated and accumulated in the photoelectric conversion unit PD are transferred to the charge holding portion MEM. The charge holding portion MEM holds charges transferred from the photoelectric conversion unit PD. When the second transfer transistor M3 is controlled to the on-state by a control signal, charges held in the charge holding portion MEM are transferred to the floating diffusion region PD. Note that, when any one of the first transfer transistors M1B, M1C, and M1D is controlled to the on-state by a control signal, charges generated and accumulated in the photoelectric conversion unit PD are transferred to the charge holding portion MEM of another pixel.

When the reset transistor M4 is controlled to the on-state by a control signal, the potential of the floating diffusion region FD is reset. When the select transistor M6 is controlled to the on-state by a control signal, a signal is output from the amplifier transistor M5 on the row of interest to the column signal line 180. At this time, the amplifier transistor M5 and the current source connected to the column signal line 180 form a source follower circuit that outputs a signal in accordance with charges transferred to the floating diffusion region FD and thereby function as an output unit. Further, at this time, the floating diffusion region FD receives charges transferred from the charge holding portion MEM and thereby functions as an input node of the source follower circuit. When the discharging transistor M2 is controlled to the on-state by a control signal, charges accumulated in the photoelectric conversion unit PD are discharged, and the potential of the cathode of the photoelectric conversion unit PD is reset.

With the above features, a configuration in which charges are generated by the photoelectric conversion unit PD and accumulated in the photoelectric conversion unit PD while charges are held in the charge holding portion MEM is realized. This enables the photoelectric conversion device to perform driving of a global electronic shutter scheme that matches the start time with the end time of charge accumulation in a plurality of photoelectric conversion units PD within the pixel array 110. The start of charge accumulation in accordance with the global electronic shutter scheme can be implemented by simultaneously controlling a plurality of discharging transistors M2 within the pixel array 110 from the on-state to the off-state to discharge charges, for example. Further, the end of charge accumulation in accordance with the global electronic shutter scheme can be implemented by simultaneously controlling a plurality of first transfer transistors M1A within the pixel array 110 from the off-state to the on-state and then again to the off-state to transfer charges, for example.

Furthermore, in the configuration of the present embodiment, it is possible to add signals of pixels on adjacent rows and adjacent columns by transferring charges from a plurality of photoelectric conversion unit PD to one charge holding portion MEM in addition to performing driving of a global electronic shutter scheme. Specifically, it is possible to add signals of pixels on adjacent two rows by controlling the first transfer transistors M1A of the pixels 170A and 170C and the first transfer transistors M1B of the pixels 170B and 170D to the on-state. Further, it is possible to add signals of pixels on adjacent two columns by controlling the first transfer transistors M1A of the pixels 170A and 170B and the first transfer transistors M1D of the pixels 170C and 170D to the on-state. In such a way, in the present embodiment, it is possible to perform driving of column addition or row addition to add charges in the charge holding portion MEM (first driving scheme) by transferring charges from the photoelectric conversion units PD of two pixels on adjacent rows or adjacent columns to one charge holding portion MEM.

Further, it is possible to add signals of four pixels by controlling the first transfer transistor M1A of the pixel 170A, the first transfer transistor M1B of the pixel 170B, the first transfer transistor M1D of the pixel 170C, and the first transfer transistor M1C of the pixel 170D to the on-state. In such a way, in the present embodiment, it is possible to perform driving of 2×2 addition to add charges in the charge holding portion MEM (second driving scheme) by transferring charges from the photoelectric conversion units PD of four pixels on adjacent rows and columns to one charge holding portion MEM.

Furthermore, by controlling the first transfer transistor M1A of each of the pixels 170A, 170B, 170C, and 170D to the on-state, it is possible to output a signal without performing addition. In such a way, in the present embodiment, by transferring charges from the photoelectric conversion units PD of four pixels to an individual charge holding portion MEM, it is possible to perform non-addition driving that performs no addition (third driving scheme).

Further, it is possible to add signals of three pixels by controlling the first transfer transistor M1A of the pixel 170A, the first transfer transistor M1B of the pixel 170B, and the first transfer transistor M1D of the pixel 170C to the on-state. In such a case, the signal from the pixel 170D is output separately from the added signals of three pixels. By outputting an addition signal corresponding to three pixels and a non-addition signal corresponding to one pixel independently of each other, it is possible to use these signals to perform a High Dynamic Range (HDR) process to expand the dynamic range. In such a way, in the present embodiment, it is also possible to perform driving to output two types of signals used for HDR (fourth driving scheme). Note that, in the signal output scheme for HDR, it is necessary to be able to output an addition signal and a non-addition signal, and the number of pixels for an addition signal is not particularly limited. For example, an addition signal corresponding to two pixels may be output. Further, pixels used for an addition signal and a pixel used for a non-addition signal can be set as appropriate out of four pixels and are not particularly limited. As described above, the pixel configuration of the present embodiment can be adapted to various addition driving and, furthermore, can be adapted to non-addition driving.

Note that, although addition of signals is possible similarly even with a configuration of transferring charges from a plurality of charge holding portions MEM to one floating diffusion region FD, the configuration of adding charges in the charge holding portion MEM of the present embodiment is more advantageous for a noise reduction ability.

In the configuration of adding charges in the floating diffusion region FD, a plurality of transfer transistors are connected to the floating diffusion region FD. Since this results in a longer region in which a transfer transistor and the floating diffusion region PD are in contact with each other, the capacitance of the floating diffusion region FD is larger due to the parasitic capacitance. This increases dark random noise. In contrast, in the configuration of adding charges in the charge holding portion MEM of the present embodiment, since the number of transfer transistors connected to the floating diffusion region FD is one, the parasitic capacitance is smaller, and dark random noise caused as described above can be reduced. Therefore, in the configuration of adding charges in the charge holding portion MEM of the present embodiment, noise can be reduced compared to the configuration of adding charges in the floating diffusion region FD.

Figure 4:
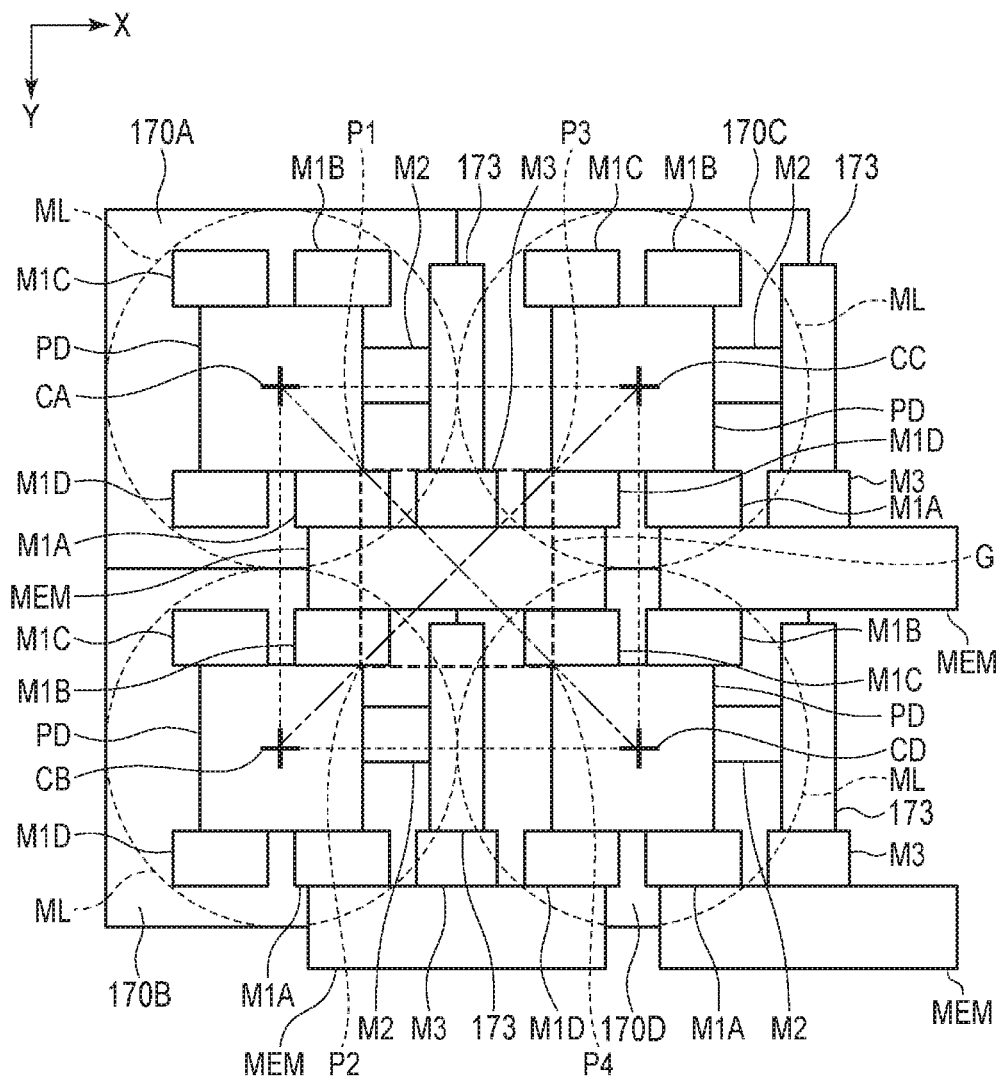
FIG. 4 is a schematic plan view illustrating an example of a pixel layout according to the first embodiment.

FIG. 4 is a schematic plan view illustrating an example of a pixel layout according to the present embodiment. FIG. 4 illustrates a schematic plan view of four pixels 170A, 170B, 170C, and 170D included in consecutive two rows and two columns of the pixel array 110. FIG. 4 schematically illustrates the photoelectric conversion units PD, the first transfer transistors M1A, M1B, M1C, and M1D, the discharging transistors M2, the charge holding portions MEM, and the second transfer transistors M3 illustrated in FIG. 3.

Further, FIG. 4 illustrates micro-lenses ML provided in association with the photoelectric conversion units PD of the pixels 170A, 170B, 170C, and 170D, respectively. Each micro-lens ML is provided such that the optical axis thereof overlaps the center of the photoelectric conversion unit PD in plan view. In other words, the plurality of micro-lenses ML define the optical centers CA, CB, CC, and CD of the photoelectric conversion units PD of the pixels 170A, 170B, 170C, and 170D, respectively.

Further, FIG. 4 illustrates readout circuit units 173. Each readout circuit unit 173 includes the reset transistor M4, the amplifier transistor M5, and the select transistor M6 illustrated in FIG. 3. The four readout circuit units 173 illustrated in FIG. 4 (a first amplifier unit, a second amplifier unit, a third amplifier unit, a fourth amplifier unit) are provided so as to correspond to the pixels 170A, 170B, 170C, and 170D.

The first transfer transistor M1A of the pixel 170A (first transfer unit) is arranged between the photoelectric conversion unit PD of the pixel 170A (first photoelectric conversion unit) and the charge holding portion MEM of the pixel 170A (first holding portion). The first transfer transistor M1B of the pixel 170B (second transfer unit) is arranged between the photoelectric conversion unit PD of the pixel 170B (second photoelectric conversion unit) and the charge holding portion MEM of the pixel 170A. The first transfer transistor M1D of the pixel 170C (third transfer unit) is arranged between the photoelectric conversion unit PD of the pixel 170C (third photoelectric conversion unit) and the charge holding portion MEM of the pixel 170A. The first transfer transistor M1C of the pixel 170D (sixth transfer unit) is arranged between the photoelectric conversion unit PD of the pixel 170D (fourth photoelectric conversion unit) and the charge holding portion MEM of the pixel 170A. Thereby, charges may be transferred to the charge holding portion MEM of the pixel 170A from one or two or more of the photoelectric conversion units PD of the four pixels 170A, 170B, 170C, and 170D. Accordingly, it is possible to output charges generated by a plurality of photoelectric conversion units PD after adding the charges in the charge holding portion MEM.

Further, the first transfer transistor M1A of the pixel 170B (fourth transfer unit) is arranged between the photoelectric conversion unit PD of the pixel 170B and the charge holding portion MEM of the pixel 170B (second holding portion). The first transfer transistor M1A of the pixel 170C (fifth transfer unit) is arranged between the photoelectric conversion unit PD of the pixel 170C and the charge holding portion MEM of the pixel 170C (third holding portion). The first transfer transistor M1A of the pixel 170D is arranged between the photoelectric conversion unit PD of the pixel 170D and the charge holding portion MEM of the pixel 170D. In such a way, the photoelectric conversion units PD of the pixels 170B, 170C, and 170D can also transfer charges to the charge holding portions MEM of corresponding pixels. Accordingly, it is possible to output charges generated by a plurality of photoelectric conversion units PD, respectively, without adding the charges.

Each charge holding portion MEM is arranged at a position that at least partially overlaps a straight line connecting the optical center CA to the optical center CD. Further, each charge holding portion MEM is arranged at a position that at least partially overlaps a straight line connecting the optical center CB to the optical center CC. In other words, the charge holding portion MEM of the pixel 170A is arranged at a position that at least partially overlaps a straight line connecting the optical centers of the diagonally located photoelectric conversion units PD of two pixels out of the pixels 170A, 170B, 170C, and 170D on two rows by two columns. The optical center of the photoelectric conversion unit PD can be regarded as the center position of a semiconductor region formed as a region used for accumulating charges. That is, when charges to be accumulated are electrons, the optical center of the photoelectric conversion unit PD can be regarded as the center position of an N-type semiconductor region used for accumulating electrons. Further, from another point of view, the optical center of the photoelectric conversion unit PD can be regarded as substantially the center of the micro-lens ML that guides light to the photoelectric conversion unit PD. Note that the center of the micro-lens ML and the center of the photoelectric conversion unit PD may be shifted from each other as the image height on an imaging plane increases (that is, as the position of a pixel is closer to the edge from the center). In such a form, the center position of the micro-lens ML of the pixel 170 at the center position of the imaging plane (pixel array 110) can be applied to each of other pixels 170.

Further, from another point of view, at least a part of the charge holding portion MEM is arranged in a region surrounded by the closest apexes of respective photoelectric conversion units PD of the pixel 170A, the pixel 170B, the pixel 170C, and the pixel 170D. The region surrounded by the closest apexes (P1, P2, P3, P4) of these four photoelectric conversion units PD is denoted as a region G in FIG. 4. The positions of these apexes can be positions of element isolation portions (formed by using various methods such as the STI, DTI, or LOCOS method) provided adjacent to the photoelectric conversion units PD, for example.

Such arrangement of the charge holding portion MEM and the photoelectric conversion units PD increases symmetry of charge transfer paths, and deterioration of characteristics due to charge transfer paths being asymmetrical or the like can be reduced. Further, since the charge holding portion MEM can be arranged at a position away from the optical center of the photoelectric conversion unit PD, noise due to incident light entering a part near the charge holding portion MEM can be reduced. Therefore, according to the present embodiment, with the arrangement of the charge holding portion MEM and the photoelectric conversion units PD as described above, a high-performance photoelectric conversion device is provided.

Note that the layout of the photoelectric conversion device may be designed such that the upper limit of charges that may be held in the charge holding portion MEM of the pixel 170A is larger than the upper limit of charges that may be held in the charge holding portion MEM of the pixel 170B, 170C, or 170D. More charges are transferred to the charge holding portion MEM in which addition of charges is performed than to the charge holding portion MEM in which addition of charges is not performed. Thus, by increasing the upper limit of charges that may be held in the charge holding portion MEM of the pixel 170A in which addition of charges is performed, it is possible to expand the dynamic range.

FIG. 5A and FIG. 5B are schematic plan views illustrating an example of arrangement of control signal lines according to the present embodiment. FIG. 5A is a diagram illustrating an arrangement example of a control signal line group 174 arranged in a first wiring layer located above a semiconductor substrate on which the photoelectric conversion units PD and respective transistors are arranged. FIG. 5B is a diagram illustrating an arrangement example of a control signal line group 175 arranged in a second wiring layer located above the first wiring layer. The control signal line groups 174 and 175 include a plurality of control signal lines extending in the X direction. Since the photoelectric conversion device of the present embodiment is of a front-illuminated type that receives light from the side on which the first wiring layer and the second wiring layer are arranged to the semiconductor substrate, the control signal line groups 174 and 175 are arranged so as to avoid the photoelectric conversion units PD in plan view. However, the present disclosure is also applicable to a back-illuminated type that receives light from the semiconductor substrate side. In such a case, it is not essential that the control signal line groups 174 and 175 be arranged so as to avoid the photoelectric conversion units PD in plan view.

The number of control signal lines used for supplying control signals to pixels of two rows by two columns illustrated in FIG. 5A and FIG. 5B is at least 23. In the present embodiment, since the first transfer transistors M1A, M1B, M1C, and M1D can be controlled independently of each other, the number of control signal lines used for controlling these first transfer transistors is 16. The number of control signal lines provided for the discharging transistor M2 is one, and the number of control signal lines provided for each of the second transfer transistor M3, the reset transistor M4, and the select transistor M6 is two.

Second Embodiment

The photoelectric conversion device of the present embodiment is different from the first embodiment in that some of control signals of a plurality of first transfer transistors are used as a common control signal to reduce the number of control signal lines. Since the remaining configurations are the same as those of the first embodiment, the description thereof will be omitted.

Figure 6A:
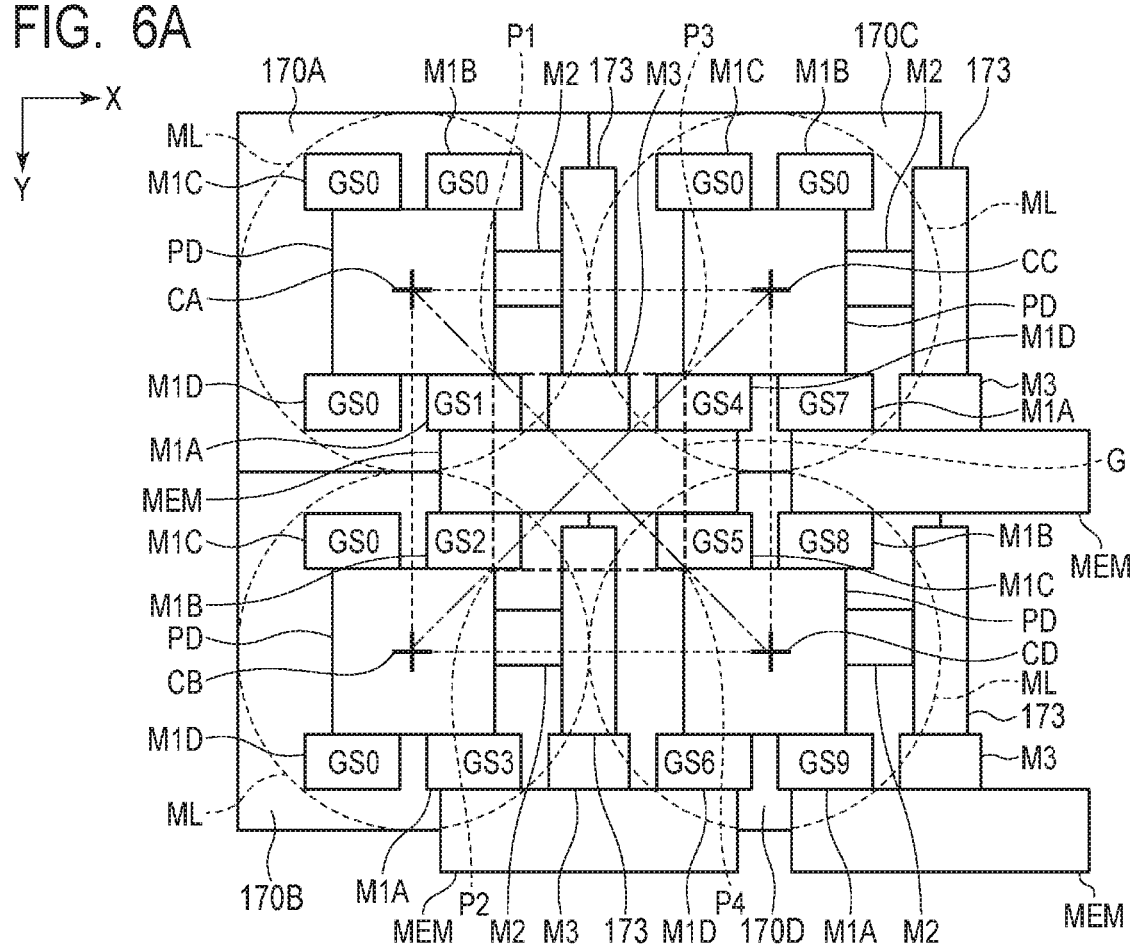
FIG. 6A and FIG. 6B are schematic plan views illustrating an example of a pixel layout and arrangement of control signal lines according to a second embodiment, respectively.
Figure 6B:
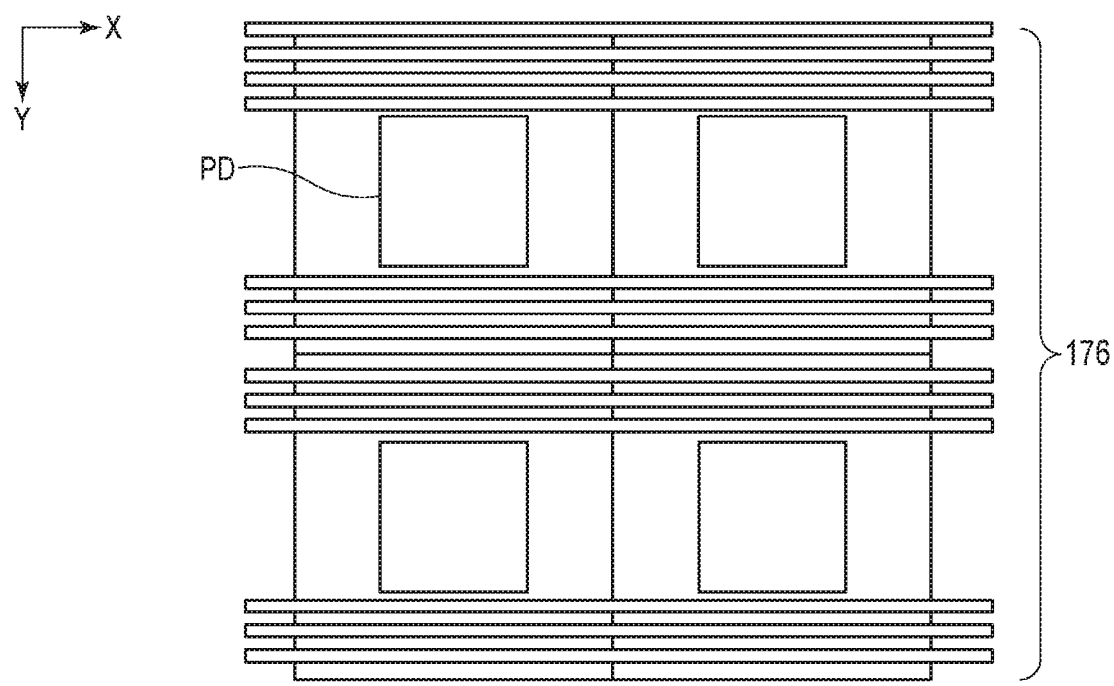

FIG. 6A is a schematic plan view illustrating an example of a pixel layout according to the present embodiment. The physical arrangement of each component illustrated in FIG. 6A is similar to that in the first embodiment. FIG. 6B is a diagram illustrating an example of arrangement of the photoelectric conversion unit PD and a control signal line group 176 arranged in a first wiring layer located above a semiconductor substrate on which respective transistors are arranged. Note that, although an example of arrangement of a second wiring layer is not illustrated in the present embodiment, some of the control signal lines may also be arranged in the second wiring layer in the same manner as in the first embodiment.

The blocks illustrating the first transfer transistors M1A, M1B, M1C, and M1D of FIG. 6A are labeled with ten types of references from GS0 to GS9. These references denote control signals to be input to the gates of respective transistors. In the first embodiment, since the four first transfer transistors M1A, M1B, M1C, and M1D provided in each of the four pixels can be controlled independently of each other, there are 16 types of control signals. In contrast, in the present embodiment, since the common control signal GS0 is input to some of the transistors, types of control signals are reduced to ten types. In the present embodiment, since the types of the control signals can be reduced by six types compared with the first embodiment, the number of required control signal lines is reduced from 23 to 17. This can increase the opening area above the photoelectric conversion unit PD to improve sensitivity. Alternatively, it is possible to employ design to reduce the gap between the photoelectric conversion units PD while securing a sufficient opening area above the photoelectric conversion unit PD, and this can reduce the pixel pitch.

FIG. 7 is a table illustrating an example of a driving method of the first transfer transistors M1A, M1B, M1C, and M1D according to the present embodiment. FIG. 7 illustrates the levels of control signals corresponding to respective modes of "non-addition", "row addition", "column addition", "2×2 addition", and "three-pixel addition", and types of signals to be read. Each transistor is turned on when a corresponding control signal is at the high level (HIGH) and is turned off when a corresponding control signal is at the low level (LOW). "A", "B", "C", and "D" in the field "read signal" correspond to signals based on charges generated by the photoelectric conversion units PD of the pixels 170A, 170B, 170C, and 170D, respectively. Further, "A+B" corresponds to an addition signal of the pixel 170A and the pixel 170B. The same applies to other denotation.

In the "non-addition" mode, the control signals GS1, GS3, GS7, and GS9 are at the high level, and the remaining control signals are at the low level. At this time, the first transfer transistor M1A of each of the pixels 170A, 170B, 170C, and 170D is controlled to be turned on. In such a case, since charges generated by the photoelectric conversion unit PD of each of the pixels are transferred to different charge holding portions MEM, no addition is performed, and a signal is output.

In the "row addition" mode, the control signals GS1, GS3, GS4, and GS6 are at the high level, and the remaining control signals are at the low level. At this time, the first transfer transistors M1A of the pixels 170A and 170B and the first transfer transistors M1D of the pixels 170C and 170D are controlled to be turned on. In such a case, since charges generated by the photoelectric conversion units PD of pixels on adjacent two columns are transferred to the same charge holding portion MEM, signals are added between pixels on the adjacent two columns.

In the "column addition" mode, the control signals GS1, GS2, GS7, and GS8 are at the high level, and the remaining control signals are at the low level. At this time, the first transfer transistors M1A of pixels 170A and 170C and the first transfer transistors M1B of the pixels 170B and 170D are controlled to be turned on. In such a case, since charges generated by the photoelectric conversion units PD of pixels on adjacent two rows are transferred to the same charge holding portion MEM, signals are added between pixels on the adjacent two rows.

In the "2×2 addition" mode, the control signals GS1, GS2, GS4, and GS5 are at the high level, and the remaining control signals are at the low level. At this time, the first transfer transistor M1A of the pixel 170A, the first transfer transistor M1B of the pixel 170B, the first transfer transistor M1D of the pixel 170C, and the first transfer transistor M1C of the pixel 170D are controlled to be turned on. In such a case, since charges generated by the photoelectric conversion units PD of four pixels on adjacent two rows by two columns are transferred to the same charge holding portion MEM, signals are added between four pixels on the adjacent two rows by two columns In the "three-pixel addition" mode, the control signals GS1, GS2, GS4, and GS8 are at the high level, and the remaining control signals are at the low level. At this time, the first transfer transistor M1A of the pixel 170A, the first transfer transistor M1B of the pixel 170B, and the first transfer transistor M1D of the pixel 170C are controlled to be turned on. Further, the first transfer transistor M1B of the pixel 170D is controlled to be turned on. In such a case, charges generated by the three photoelectric conversion units PD of the four pixels on adjacent two rows by two columns are transferred to the same charge holding portion MEM, and signals are added between three pixels. Further, charges generated by the remaining photoelectric conversion unit PD are transferred to another charge holding portion MEM without being added. By outputting an addition signal for three pixels and a non-addition signal for a pixel separately, it is possible to perform an HDR process to expand the dynamic range by using these signals.

According to the present embodiment, a high-performance photoelectric conversion device is provided in the same manner as in the first embodiment. Further, in the present embodiment, it is possible to reduce the number of control signal lines while making it possible to output signals corresponding to various addition schemes in the same manner as in the first embodiment and thereby obtain an advantageous effect of improved sensitivity or a reduced pixel pitch.

Note that, as illustrated in FIG. 7, the control signal GS0 is always at the low level in any modes, and a corresponding first transfer transistor is always in the off-state. Therefore, when the off-state of the transistor can be implemented, the control signal line used for transmitting the control signal GS0 may be omitted. Further, the pixel configuration may be modified by omitting the first transfer transistor corresponding to the control signal GS0 so that the photoelectric conversion unit PD and the charge holding portion MEM are insulated from each other. Further, the pixel configuration can be modified by emulating a gate electrode of the first transfer transistor corresponding to the control signal GS0 so that a dummy electrode having no charge transfer function is arranged near the photoelectric conversion unit PD and the charge holding portion MEM. In the configuration in which the first transfer transistor is omitted, since the arrangement of electrodes around the photoelectric conversion units PD is asymmetric, asymmetricity of the electrodes may affect the photoelectric conversion characteristic for incident light. In contrast, in the configuration in which the dummy electrode is provided, since the arrangement of the electrode can be symmetric, influence on the characteristic due to the first transfer transistor being not provided can be reduced.

Third Embodiment

The photoelectric conversion device of the present embodiment is different from the second embodiment in that more control signals of a plurality of the first transfer transistors are used as a common control signal to further reduce the number of control signal lines. Since the remaining configurations are the same as those of the second embodiment, the description thereof will be omitted.

Figure 8A:
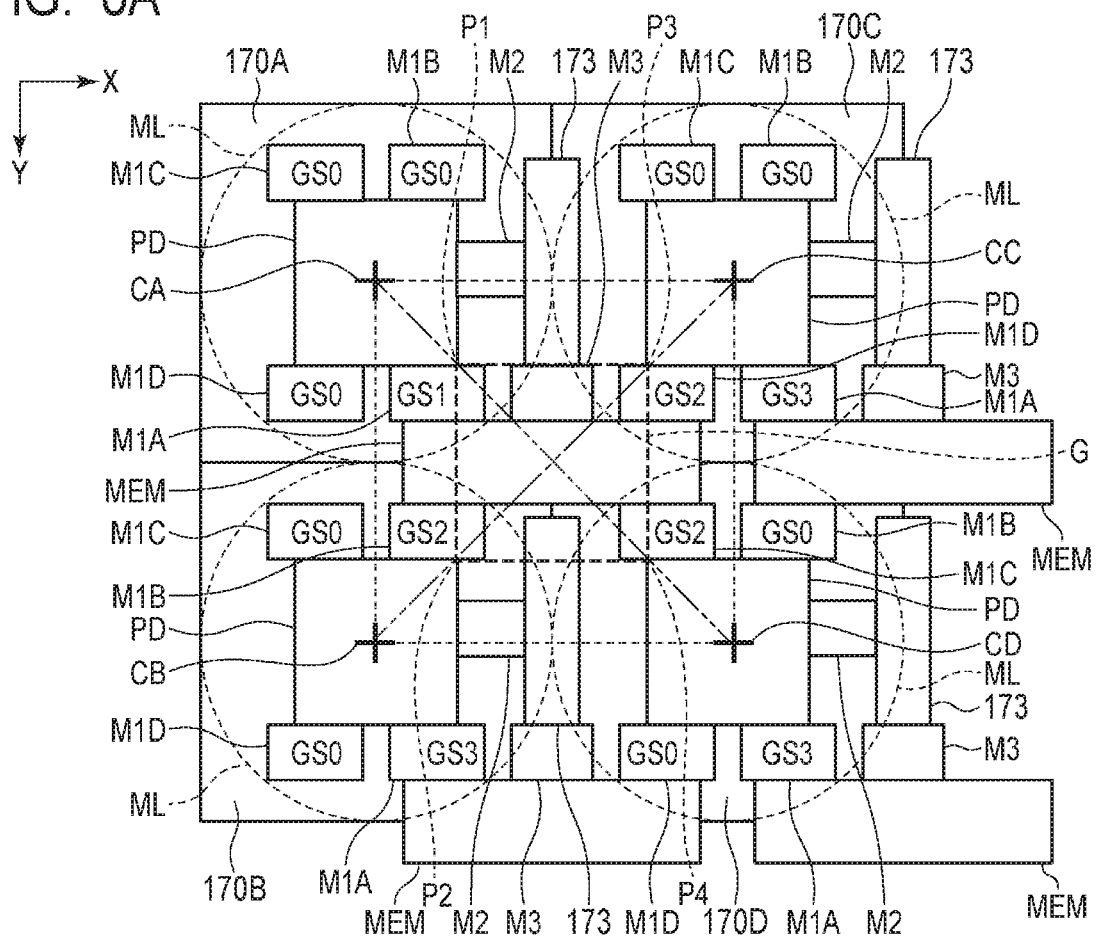
FIG. 8A and FIG. 8B are schematic plan views illustrating an example of a pixel layout and arrangement of control signal lines according to a third embodiment, respectively.
Figure 8B:
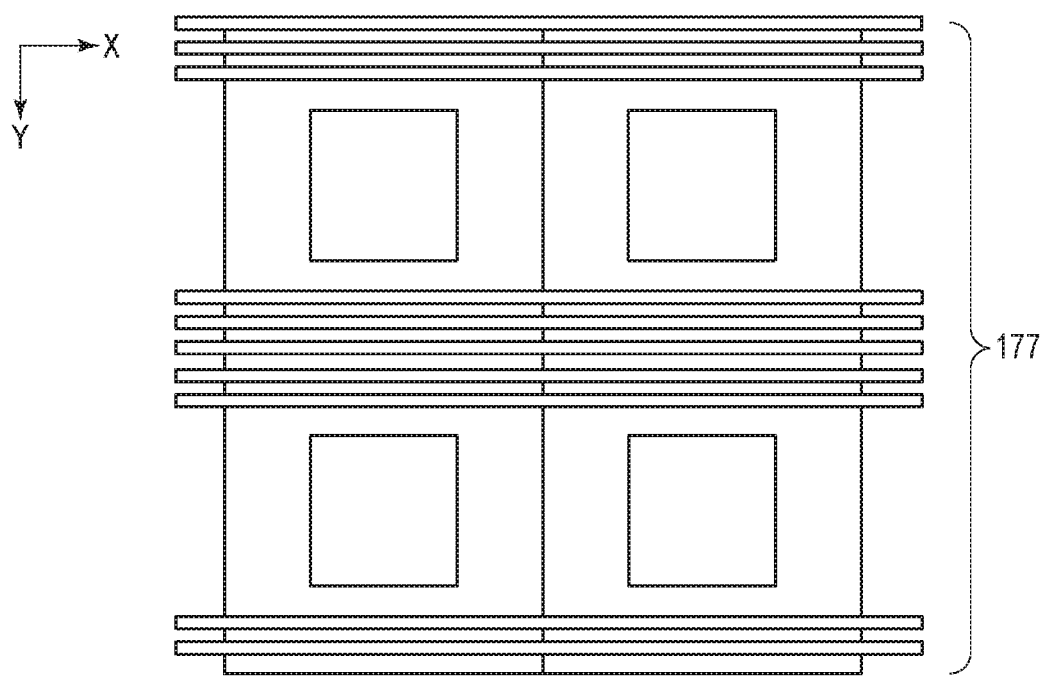

FIG. 8A is a schematic plan view illustrating an example of a pixel layout according to the present embodiment. The physical arrangement of each component illustrated in FIG. 8A is similar to that in the first embodiment and the second embodiment. FIG. 8B is a diagram illustrating an example of arrangement of the photoelectric conversion unit PD and the control signal line group 177 arranged in the first wiring layer located above the semiconductor substrate on which respective transistors are arranged. Note that, although an example of arrangement of the second wiring layer is not illustrated in the present embodiment, some of the control signal lines may also be arranged in the second wiring layer in the same manner as in the first embodiment.

The blocks illustrating the first transfer transistors M1A, M1B, M1C, and M1D of FIG. 8A are labeled with four types of references from GS0 to GS3. In the present embodiment, the types of control signals are reduced to four types. In the present embodiment, since the types of the control signals can be reduced by 12 types compared with the first embodiment, the number of required control signal lines is reduced from 23 to 11. This can increase the opening area above the photoelectric conversion unit PD to improve sensitivity. Alternatively, it is possible to employ design to reduce the gap between the photoelectric conversion units PD while securing a sufficient opening area above the photoelectric conversion unit PD, and this can reduce the pixel pitch.

Figures 9, 10:
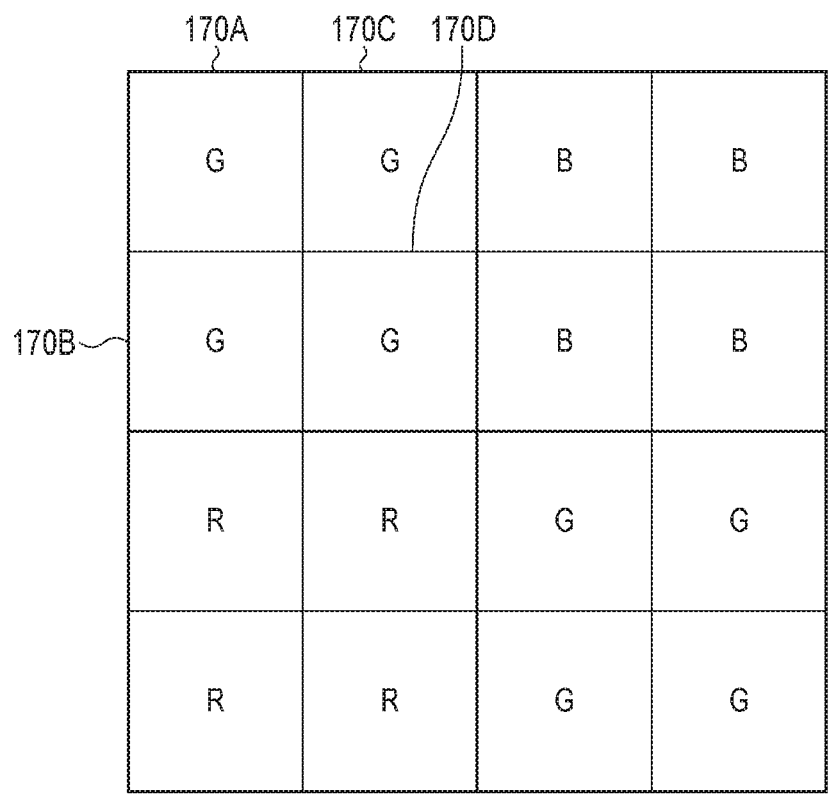
FIG. 9 is a table illustrating an example of a drive method of a first transfer transistor according to the third embodiment.
FIG. 10 is a schematic plan view illustrating an example of arrangement of color filters according to a fourth embodiment.

FIG. 9 is a table illustrating an example of a drive method of the first transfer transistors M1A, M1B, M1C, and M1D according to the present embodiment. In the present embodiment, the types of control signals supplied to the first transfer transistor connected to the charge holding portion MEM of the pixel 170A are reduced to two types, and available modes are thus limited to the "non-addition" mode and the "2×2 addition" mode. Since the specific operation of each mode is substantially the same as that of the second embodiment, the description thereof will be omitted.

According to the present embodiment, a high-performance photoelectric conversion device is provided in the same manner as in the first embodiment and the second embodiment. Further, in the present embodiment, although types of modes are limited compared with the second embodiment, the number of control signal lines can be further reduced compared with the configuration of the second embodiment, and thereby the advantageous effect of improved sensitivity or a reduced pixel pitch can be further enhanced.

Fourth Embodiment

The photoelectric conversion device of the present embodiment has color filters in any of the photoelectric conversion devices in the first to third embodiments. Since the remaining configurations are the same as those of the first to third embodiments, the description thereof will be omitted.

FIG. 10 is a schematic plan view illustrating an example of arrangement of color filters according to the present embodiment. The photoelectric conversion device of the present embodiment has a color filter above each of the pixels. The color filter has either color of red (R), green (G), or blue (B). Arrangement of colors of the color filters is the Bayer Arrangement in which the four pixels 170A, 170B, 170C, and 170D of the same color are defined as a unit, as illustrated in FIG. 10. When the color filters corresponding to the photoelectric conversion units PD of the pixels 170A, 170B, 170C, and 170D are defined as a first color filter, a second color filter, a third color filter, and a fourth color filter, respectively, all the first to fourth color filters have the same color. That is, all the four pixels 170A, 170B, 170C, and 170D subjected to addition have the same color.

With such arrangement, in each of various modes such as the "non-addition" mode or the "2×2 addition" mode, it is possible to cause pixel signals of the same color to be added and not to cause pixel signals of different colors to be added. Therefore, the photoelectric conversion device of the present embodiment can acquire a color image in any mode.

According to the present embodiment, a high-performance photoelectric conversion device is provided in the same manner as in the first embodiment to the third embodiment. Further, in the present embodiment, the photoelectric conversion device which can acquire a color image is provided.

Fifth Embodiment

Figure 11:
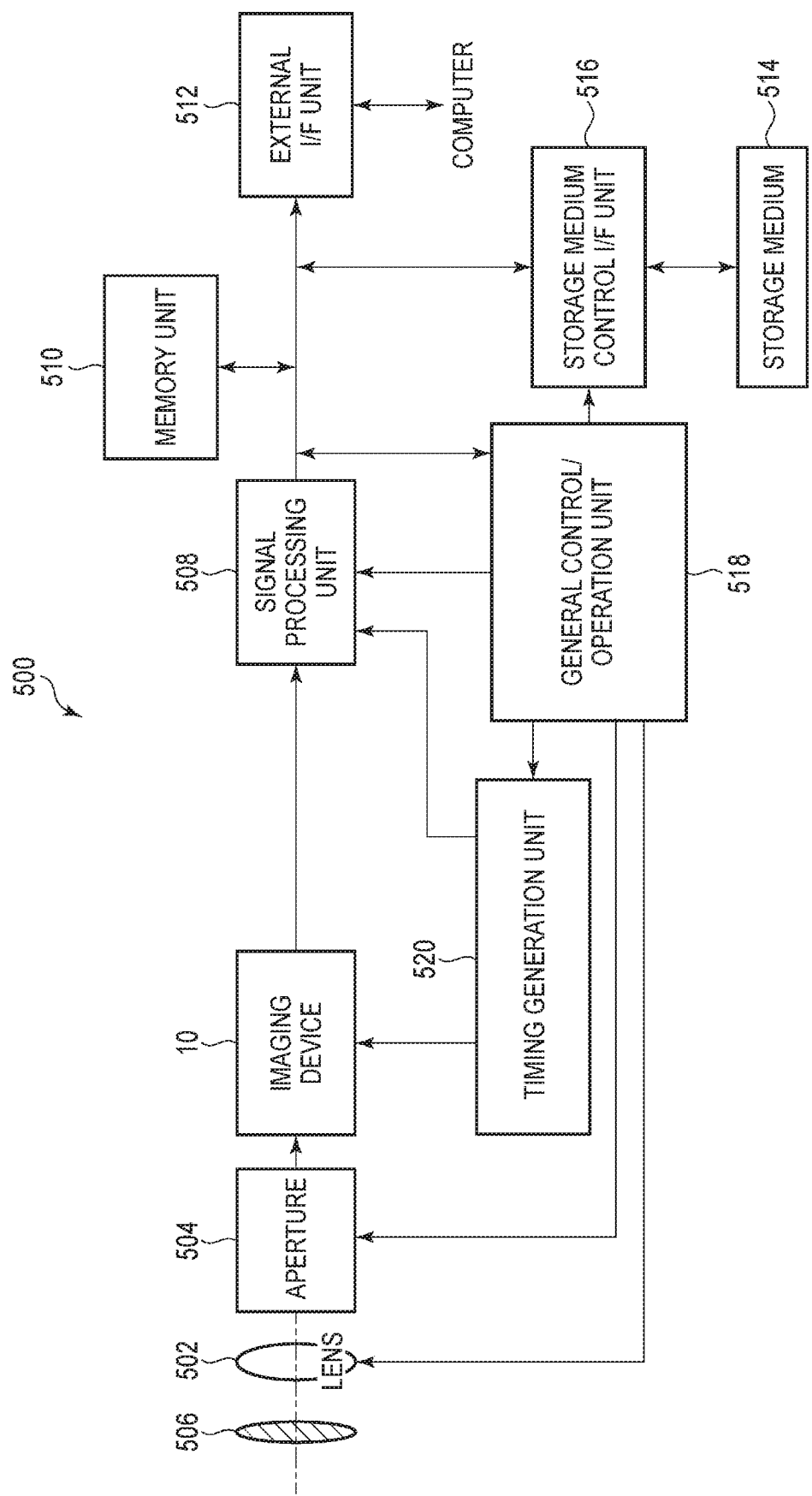
FIG. 11 is a block diagram illustrating a configuration example of an imaging system according to a fifth embodiment.

Next, an example of an apparatus to which the photoelectric conversion device according to the embodiments described above is applied will be described. FIG. 11 is a block diagram illustrating the configuration of an imaging system 500 according to the present embodiment. An imaging device 10 illustrated in FIG. 11 is any one of the photoelectric conversion device described in the above first to fourth embodiments. The imaging system 500 to which the imaging device 10 is applicable may be, for example, a digital camera, a digital camcorder, a surveillance camera, or the like. FIG. 11 illustrates a configuration example of a digital camera to which the imaging device 10, which is an example of the photoelectric conversion device described in the above embodiments, is applied.

The imaging system 500 illustrated as an example in FIG. 11 has the imaging device 10, a lens 502 that captures an optical image of a subject onto the imaging device 10, an aperture 504 for changing a light amount passing through the lens 502, and a barrier 506 for protecting the lens 502. The lens 502 and the aperture 504 form an optical system that collects a light onto the imaging device 10.

The imaging system 500 further has a signal processing unit 508 that processes an output signal output from the imaging device 10. The signal processing unit 508 performs a signal processing operation to perform various correction or compression on the input signal if necessary and output the processed input signal.

The imaging system 500 further has a buffer memory unit 510 used for temporarily storing image data therein and an external interface unit (external I/F unit) 512 used for communicating with an external computer or the like. The imaging system 500 further has a storage medium 514 such as a semiconductor memory used for performing storage or readout of imaging data and a storage medium control interface unit (storage medium control I/F unit) 516 used for performing storage or readout on the storage medium 514. Note that the storage medium 514 may be embedded in the imaging system 500 or may be removable.

Furthermore, the imaging system 500 has a general control/operation unit 518 that performs various calculation and controls the overall digital camera and a timing generation unit 520 that outputs various timing signals to the imaging device 10 and the signal processing unit 508. Herein, the timing signal or the like may be externally input, and the imaging system 500 may have at least the imaging device 10 and the signal processing unit 508 that processes an output signal output from the imaging device 10. The general control/operation unit 518 and the timing generation unit 520 may be configured to perform a part or all of the function related to control of the photoelectric conversion device, such as generation of a control signal, generation of a reference voltage, or the like in the embodiments described above.

The imaging device 10 outputs an image signal to the signal processing unit 508. The signal processing unit 508 performs predetermined signal processing on an image signal output from the imaging device 10 and outputs image data. Further, the signal processing unit 508 uses an image signal to generate an image.

As described above, the imaging system 500 of the present embodiment includes the imaging device 10 according to any of the first to fourth embodiments. Accordingly, the imaging system 500 that enables a higher quality image capturing can be realized.

Sixth Embodiment

Figure 12A:
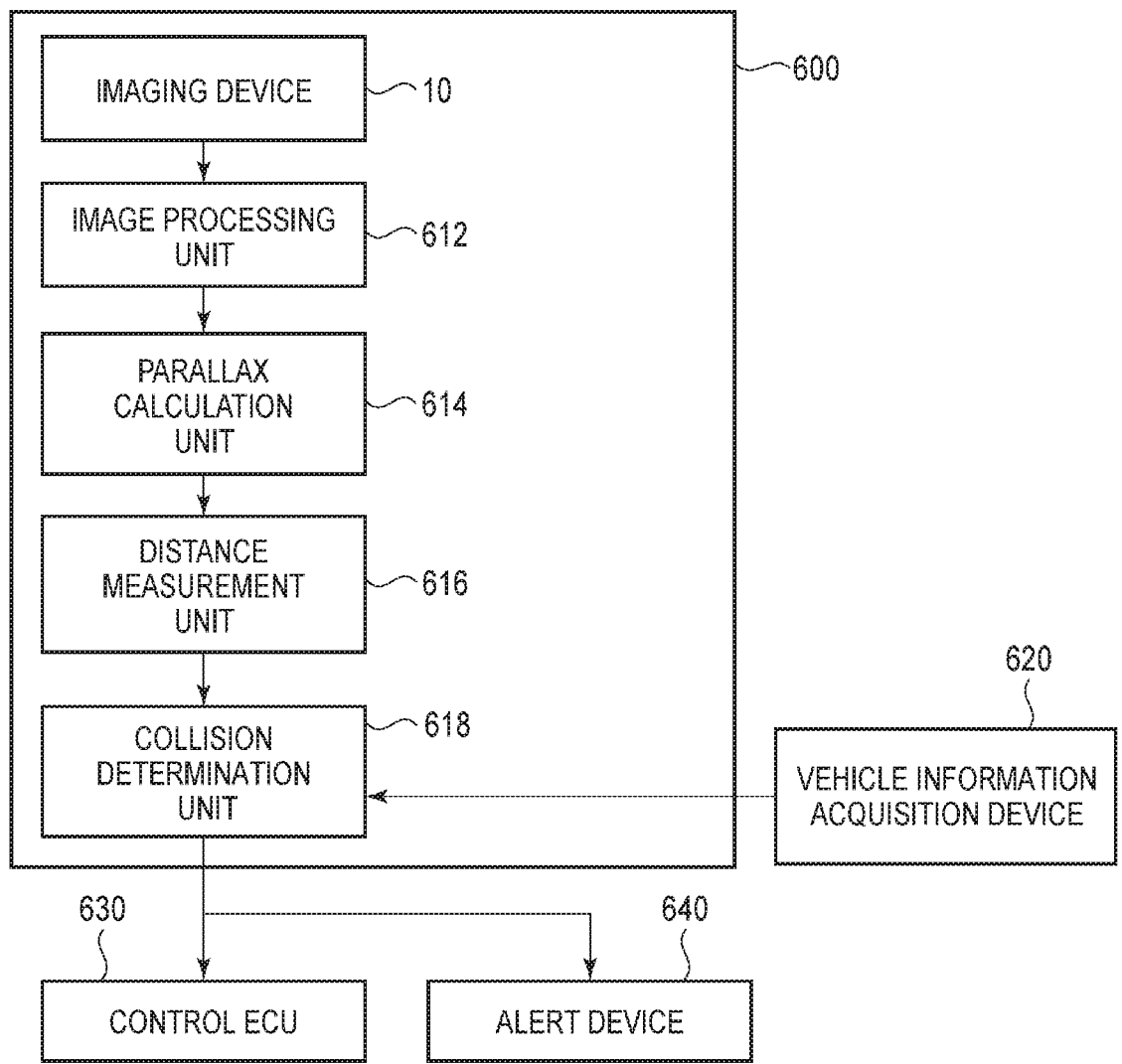
FIG. 12A and FIG. 12B are diagrams illustrating a configuration example of an imaging system and a moving body according to a sixth embodiment.
Figure 12B:
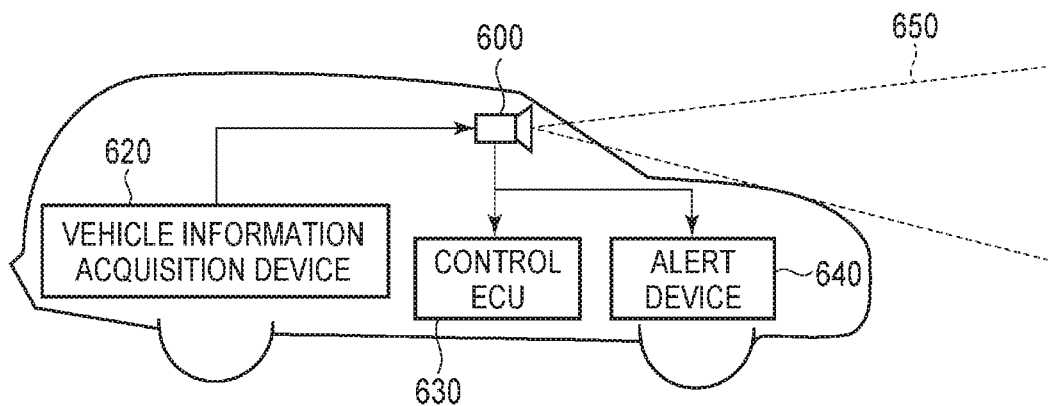

FIG. 12A and FIG. 12B are diagrams illustrating a configuration of an imaging system 600 and a moving body according to the present embodiment. FIG. 12A illustrates an example of an imaging system 600 related to an on-vehicle camera. An imaging system 600 has an imaging device 10 that is an example of the photoelectric conversion device described in any of the above first to fourth embodiments. The imaging system 600 has an image processing unit 612 that performs image processing on a plurality of image data acquired by the imaging device 10 and a parallax calculation unit 614 that calculates a parallax (a phase difference of parallax images) from the plurality of image data acquired by the imaging system 600. Further, the imaging system 600 has a distance measurement unit 616 that calculates a distance to the object based on the calculated parallax and a collision determination unit 618 that determines whether or not there is a collision possibility based on the calculated distance. Herein, the parallax calculation unit 614 and the distance measurement unit 616 are an example of a distance information acquisition unit that acquires distance information on the distance to the object. That is, the distance information is information on a parallax, a defocus amount, a distance to an object, or the like. The collision determination unit 618 may use any of the distance information to determine the collision possibility. The distance information acquisition unit may be implemented by dedicatedly designed hardware or may be implemented by a software module. Further, the distance information acquisition unit may be implemented by a field programmable gate array (FPGA), an application specific integrated circuit (ASIC), or the like or may be implemented by a combination thereof.

The imaging system 600 is connected to the vehicle information acquisition device 620 and can acquire vehicle information such as a vehicle speed, a yaw rate, a steering angle, or the like. Further, the imaging system 600 is connected to a control ECU 630, which is a control device that outputs a control signal for causing a vehicle to generate braking force based on a determination result by the collision determination unit 618. That is, the control ECU 630 is an example of a moving body control unit that controls a moving body based on distance information. Further, the imaging system 600 is also connected to an alert device 640 that issues an alert to the driver based on a determination result by the collision determination unit 618. For example, when the collision probability is high as the determination result of the collision determination unit 618, the control ECU 630 performs vehicle control to avoid a collision or reduce damage by applying a brake, pushing back an accelerator, suppressing engine power, or the like. The alert device 640 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 600. FIG. 12B illustrates the configuration of the imaging system 600 when a front area of a vehicle (a capturing area 650) is captured. The vehicle information acquisition device 620 transmits an instruction to cause the imaging system 600 to operate and perform image capturing. The imaging system 600 of the present embodiment including the imaging device 10 according to the first to fourth embodiments can further improve the ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as the subject vehicle and can be applied to a moving body (moving apparatus) such as a ship, an airplane, or an industrial robot, for example. In addition, the imaging system can be widely applied to a device which utilizes object recognition, such as an intelligent transportation system (ITS), without being limited to moving bodies.

Other Embodiments

Note that each of the embodiments described above merely illustrates an embodied example in implementing the disclosure, and the technical scope of the disclosure is not to be construed in a limiting sense by these embodiments. That is, the disclosure can be implemented in various forms without departing from the technical concept or the primary feature thereof. For example, it should be understood that an embodiment in which a part of the configuration of any of the embodiments is added to another embodiment or an embodiment in which a part of the configuration of any of the embodiments is replaced with a part of the configuration of another embodiment is also one of the embodiments to which the disclosure may be applied.

Further, although it is assumed in the description of the above embodiments that the scheme of electronic shutter used for driving the photoelectric conversion device is a global electronic shutter scheme, the scheme is not limited thereto and may be, for example, a rolling shutter scheme.

Further, although the layout, a drive method, or the like have been described for four pixels of two rows by two columns in the illustration of the above embodiments, this is a mere example, and the number of added pixels can be changed as appropriate. To realize both addition of signals of two rows and addition of signals of two columns, the number of added pixels is at least three. Further, the number of added pixels may be five or greater.

Embodiments of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-199911, filed Nov. 1, 2019, which is hereby incorporated by reference herein in its entirety.

What is claimed is:

1. A photoelectric conversion device comprising:
    a substrate;
    a first photoelectric conversion unit, a second photoelectric conversion unit, and a third photoelectric conversion unit that are arranged on the substrate and each configured to generate charges in accordance with incident light;
    a first holding portion arranged on the substrate and configured to hold charges transferred from at least one of the first photoelectric conversion unit, the second photoelectric conversion unit, and the third photoelectric conversion unit;
    a first transfer unit arranged on the substrate and configured to transfer charges from the first photoelectric conversion unit to the first holding portion;
    a second transfer unit arranged on the substrate and configured to transfer charges from the second photoelectric conversion unit to the first holding portion;
    a third transfer unit arranged on the substrate and configured to transfer charges from the third photoelectric conversion unit to the first holding portion; and
    a first amplifier unit including an input node configured to receive charges transferred from the first holding portion;
    wherein the first photoelectric conversion unit and the second photoelectric conversion unit are arranged adjacent to each other along a first direction in plan view with respect to the substrate,
    wherein the first photoelectric conversion unit and the third photoelectric conversion unit are arranged adjacent to each other along a second direction, which is different from the first direction, in the plan view, and
    wherein the first holding portion is arranged at a position at least partially overlapping a straight line connecting an optical center of the second photoelectric conversion unit to an optical center of the third photoelectric conversion unit in the plan view.

2. The photoelectric conversion device according to claim 1, wherein the photoelectric conversion device is configured to be driven by a first drive scheme in which each of the first transfer unit and the second transfer unit transfers charges to the first holding portion to cause charges generated by the first photoelectric conversion unit and the second photoelectric conversion unit to be added in the first holding portion.

3. The photoelectric conversion device according to claim 1, wherein the photoelectric conversion device is configured to be driven by a second drive scheme in which each of the first transfer unit, the second transfer unit, and the third transfer unit transfers charges to the first holding portion to cause charges generated by the first photoelectric conversion unit, the second photoelectric conversion unit, and the third photoelectric conversion unit to be added in the first holding portion.

4. The photoelectric conversion device according to claim 1 further comprising:
    a second holding portion and a third holding portion that are arranged on the substrate and configured to hold charges;
    a fourth transfer unit that is arranged on the substrate and configured to transfer charges from the second photoelectric conversion unit to the second holding portion;
    a fifth transfer unit that is arranged on the substrate and configured to transfer charges from the third photoelectric conversion unit to the third holding portion;
    a second amplifier unit including an input node configured to receive charges transferred from the second holding portion; and
    a third amplifier unit including an input node configured to receive charges transferred from the third holding portion.

5. The photoelectric conversion device according to claim 4, wherein the photoelectric conversion device is configured to be driven by a third drive scheme in which the first transfer unit transfers charges generated by the first photoelectric conversion unit to the first holding portion, the fourth transfer unit transfers charges generated by the second photoelectric conversion unit to the second holding portion, and the fifth transfer unit transfers charges generated by the third photoelectric conversion unit to the third holding portion.

6. The photoelectric conversion device according to claim 4, wherein the photoelectric conversion device is configured to be driven by a fourth drive scheme in which the first transfer unit and the second transfer unit transfer charges to the first holding portion to cause charges generated by the first photoelectric conversion unit and the second photoelectric conversion unit to be added in the first holding portion and the fifth transfer unit transfers charges to the third holding portion.

7. The photoelectric conversion device according to claim 4, wherein an upper limit to which charges are held in the first holding portion is larger than an upper limit to which charges are held in the second holding portion or the third holding portion.

8. The photoelectric conversion device according to claim 1 further comprising a dummy electrode that is arranged near at least one of the first photoelectric conversion unit, the second photoelectric conversion unit, and the third photoelectric conversion unit and configured to have no function of transferring charges.

9. The photoelectric conversion device according to claim 1 further comprising:
    a first color filter arranged in association with the first photoelectric conversion unit;
    a second color filter arranged in association with the second photoelectric conversion unit; and
    a third color filter arranged in association with the third photoelectric conversion unit,
    wherein the first color filter, the second color filter, and the third color filter have the same color.

10. The photoelectric conversion device according to claim 1, wherein the first transfer unit, the second transfer unit, and the third transfer unit operate based on control signals that are different from each other.

11. The photoelectric conversion device according to claim 1, wherein the second transfer unit and the third transfer unit operate based on a common control signal.

12. The photoelectric conversion device according to claim 1 further comprising a micro-lens that guides light to one of the first photoelectric conversion unit, the second photoelectric conversion unit, and the third photoelectric conversion unit,
    wherein the optical center is the center of the micro-lens.

13. The photoelectric conversion device according to claim 1 further comprising:
    a fourth photoelectric conversion unit that is arranged on the substrate and configured to generate charges in accordance with incident light; and a sixth transfer unit that is arranged on the substrate and configured to transfer charges from the fourth photoelectric conversion unit to the first holding portion, wherein the third photoelectric conversion unit and the fourth photoelectric conversion unit are arranged adjacent to each other along the first direction in the plan view, and wherein the second photoelectric conversion unit and the fourth photoelectric conversion unit are arranged adjacent to each other along the second direction in the plan view.

14. A photoelectric conversion device comprising:

a substrate;

a first photoelectric conversion unit, a second photoelectric conversion unit, a third photoelectric conversion unit, and a fourth photoelectric conversion unit that are arranged on the substrate and each configured to generate charges in accordance with incident light;

a first holding portion that is arranged on the substrate and configured to hold charges transferred from at least one of the first photoelectric conversion unit, the second photoelectric conversion unit, the third photoelectric conversion unit, and the fourth photoelectric conversion unit;

a first transfer unit arranged on the substrate and configured to transfer charges from the first photoelectric conversion unit to the first holding portion;

a second transfer unit arranged on the substrate and configured to transfer charges from the second photoelectric conversion unit to the first holding portion;

a third transfer unit arranged on the substrate and configured to transfer charges from the third photoelectric conversion unit to the first holding portion;

a fourth transfer unit arranged on the substrate and configured to transfer charges from the fourth photoelectric conversion unit to the first holding portion; and a first amplifier unit including an input node configured to receive charges transferred from the first holding portion;

wherein the first photoelectric conversion unit and the second photoelectric conversion unit are arranged adjacent to each other along a first direction in plan view with respect to the substrate, wherein the first photoelectric conversion unit and the third photoelectric conversion unit are arranged adjacent to each other along a second direction, which is different from the first direction, in the plan view, wherein the second photoelectric conversion unit and the fourth photoelectric conversion unit are arranged adjacent to each other along the second direction in the plan view, and wherein at least a part of the first holding portion is arranged in a region surrounded by the closest apexes of the first photoelectric conversion unit, the second photoelectric conversion unit, the third photoelectric conversion unit, and the fourth photoelectric conversion unit in the plan view.

15. The photoelectric conversion device according to claim 13, wherein the first holding portion is arranged at a position at least partially overlapping a straight line connecting an optical center of the first photoelectric conversion unit to an optical center of the fourth photoelectric conversion unit in the plan view.

16. The photoelectric conversion device according to claim 14, wherein the first holding portion is arranged at a position at least partially overlapping a straight line connecting an optical center of the first photoelectric conversion unit to an optical center of the fourth photoelectric conversion unit in the plan view.

17. An imaging system comprising:

the photoelectric conversion device according to claim 1; and a signal processing unit configured to process a signal output from the photoelectric conversion device.

18. An imaging system comprising:

the photoelectric conversion device according to claim 14; and a signal processing unit configured to process a signal output from the photoelectric conversion device.

19. A moving body comprising:

the photoelectric conversion device according to claim 1;

a distance information acquisition unit configured to acquire distance information on a distance to an object, from a parallax image based on signals from the photoelectric conversion device; and a control unit configured to control the moving body based on the distance information.

20. A moving body comprising:

the photoelectric conversion device according to claim 14;

a distance information acquisition unit configured to acquire distance information on a distance to an object, from a parallax image based on signals from the photoelectric conversion device; and a control unit configured to control the moving body based on the distance information.

* * * * *